US006649512B1

(12) United States Patent
Lee et al.

(10) Patent No.: US 6,649,512 B1
(45) Date of Patent: Nov. 18, 2003

(54) METHOD FOR IMPROVING ADHESION OF A LOW K DIELECTRIC TO A BARRIER LAYER

(75) Inventors: Shyh-Dar Lee, Hsinchu Hsien (TW); Chen-Chiu Hsue, Hsinchu (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 10/165,739

(22) Filed: Jun. 7, 2002

(51) Int. Cl.⁷ ........................................... H01L 21/4763

(52) U.S. Cl. ............................................... 438/623

(58) Field of Search ................... 438/623, 628, 438/798

(56) References Cited

U.S. PATENT DOCUMENTS

| | | | | |
|---|---|---|---|---|
| 6,071,809 A | * | 6/2000 | Zhao | 438/634 |
| 6,472,306 B1 | * | 10/2002 | Lee et al. | 438/623 |
| 6,509,623 B2 | * | 1/2003 | Zhao | 257/522 |
| 6,569,777 B1 | * | 5/2003 | Hsu et al. | 438/725 |

* cited by examiner

*Primary Examiner*—David Nelms
*Assistant Examiner*—Quoc Hoang
(74) *Attorney, Agent, or Firm*—Merchant & Gould P.C.

(57) ABSTRACT

A method for improving adhesion of a low k dielectric to a barrier layer. A substrate covered by an insulating layer having copper interconnects is provided. A sealing layer is formed on the copper interconnects and the insulating layer. A plasma treatment is performed on the sealing layer by a reaction gas including at least one of $CO_2$, $NH_3$, $NO_2$, $SiH_4$, trimethylsilane, and tetramethylsilane. A low k dielectric layer is formed on the sealing layer.

18 Claims, 5 Drawing Sheets

METHOD FOR IMPROVING ADHESION OF A LOW K DIELECTRIC TO A BARRIER LAYER

BACKGROUND OF THE INVENTION

1. Field of the Invention

The invention relates to the fabrication of semiconductor devices, and more particularly to a method for improving adhesion of a low k dielectric to a barrier layer in the damascene process.

2. Description of the Related Art

As integrated circuit feature sizes continue to decrease, it has become advantageous to construct metal connections of copper instead of aluminum. Copper has a lower resistivity than aluminum, and therefore can form higher speed connections for a given line width.

Copper has disadvantages when compared to aluminum that must be overcome. For example, copper is much more susceptible to oxidation during processing. Copper also tends to diffuse into adjacent materials, including dielectrics. To use copper for interconnections, therefore, it is necessary to encapsulate the copper in barrier materials.

It is common in the art to deposit a barrier of a metal material after the copper layer is deposited, typically called a sealing layer. Typically in the art, this sealing layer (also called a cap layer, or an encapsulation layer) overlying the copper is composed of silicon nitride, though other materials are used.

FIG. 1 is a cross-section showing a dual damascene wiring according to the prior art. A semiconductor substrate 100 and an insulating layer 102 are depicted. Interconnection trenches are formed in the insulating layer 102, and a copper layer 104 has been deposited overlying the insulating layer 102 and filling the trenches. The excess copper layer 104 is then polished back to the insulating layer 102 by chemical mechanical polishing (CMP). Thereafter, a sealing layer 106 is deposited. A low k dielectric layer 108 having dual damascene structures is formed on the sealing layer 106.

Also, a copper layer 110 is deposited overlying the low k dielectric layer 108 and filling the dual damascene structures. Herein, the copper layer 110 in the dual damascene structures is connected to the copper interconnect 104 through removal of part of the sealing layer 106, as shown in FIG. 1. The excess copper layer 110 is then polished back to the low k dielectric layer 108 by CMP.

This sealing layer 106, typically silicon nitride (SiN), serves as a metal barrier layer to prevent the copper atoms from the layers 104, 110 diffusing into insulating layer 102 and the low k dielectric layer 108. In addition, the sealing layer 106 can be used as an etch stop layer for a dual damascene process.

However, the sealing layer between the low k dielectric and copper interconnects creates reliability problems such as copper line-to-line electronic migration (EM) and time dependent dielectric breakdown (TDDB) between copper lines. For example, after being deposited onto the copper surface, an additional dielectric layer will be deposited over the sealing layer. The deposition of the dielectric layer produces stress, which can crack or break the sealing layer. Moreover, in the subsequent CMP of dual damascene process, poor adhesion between the sealing layer and dielectric layers causes the dielectric layer to peel from the sealing layer. The peeling of the dielectric layer creates a path for copper to diffuse outward and for moisture or other contaminates to diffuse inward.

SUMMARY OF THE INVENTION

Accordingly, it is an object of the present invention to perform a plasma treatment on a sealing layer to enhance adhesion between the low k dielectric layer and the sealing layer.

It is another object of the invention to form an adhesion layer between the low k dielectric layer and the sealing layer to prevent sealing layer damage during formation of the low k dielectric layer and peeling of the low k dielectric layer after subsequent CMP.

An aspect of this invention is to provide a method for forming a barrier layer between a low k dielectric and metal interconnects, comprising the steps of: providing a substrate covered by an insulating layer having the metal interconnects; forming a sealing layer on the metal interconnects and the insulating layer; performing a plasma treatment on the sealing layer by a reaction gas including at least one of $CO_2$, $NH_3$, $NO_2$, $SiH_4$, trimethylsilane (3MS), and tetramethylsilane (4MS); and forming a low k dielectric layer on the sealing layer. The sealing layer is composed of SiN, SiC, SiCH, SiCO or SiCN.

Another aspect of this invention is to provide a method for forming a barrier layer between a low k dielectric and metal interconnects, comprising the steps of: providing a substrate covered by an insulating layer having the metal interconnects; forming a sealing layer on the metal interconnects and the insulating layer; forming an adhesion layer on the sealing layer; and forming a low k dielectric layer on the adhesion layer. The sealing layer is composed of SiN, SiC, SiCH, SiCO or SiCN. Moreover, the adhesion layer is formed by chemical vapor deposition using a reaction gas including at least one of $CO_2$, $NH_3$, $NO_2$, $SiH_4$, 3MS, and 4MS or is formed by coating silicate solution.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Embodiments of the present invention are now described with FIGS. 2a–2d and FIGS. 3a–3d.

Figure 1:
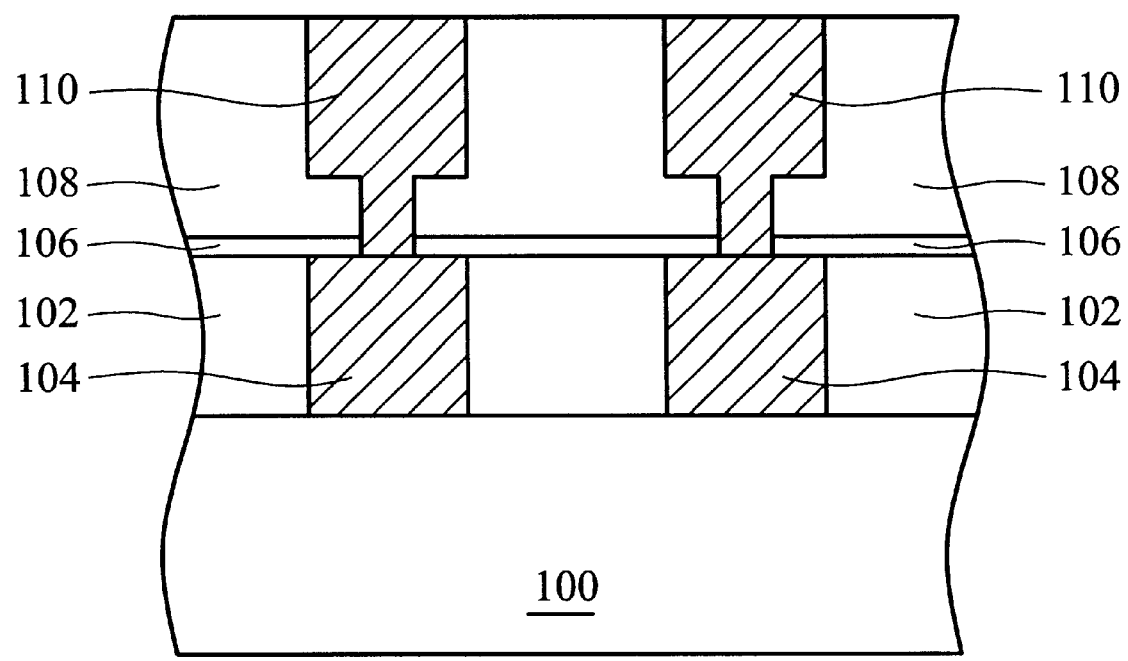
FIG. 1 is a sectional diagram showing a dual damascene wiring according to the prior art.
Figure 2A:
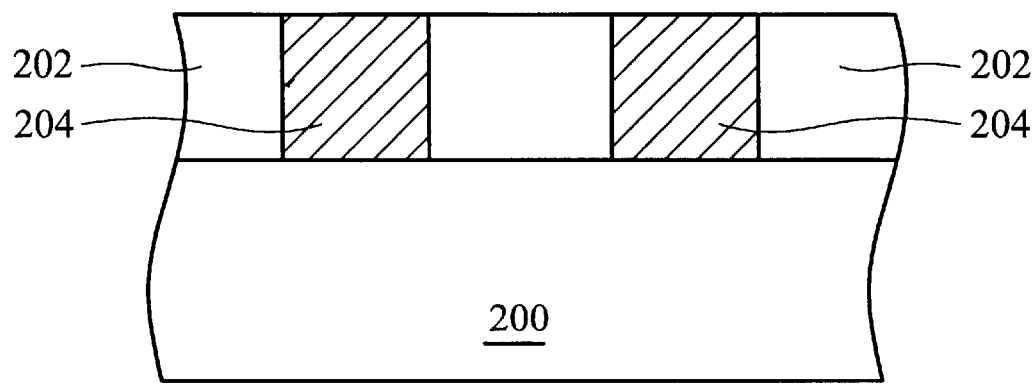
FIGS. 2a–2d are sectional diagrams showing a dual damascene wiring according to the first embodiment of the present invention.

FIGS. 2a–2d show a dual damascene wiring according to the first embodiment of the present invention. In FIG. 2a, a substrate 200 is provided. The substrate 200 is understood to possibly include a semiconductor wafer, and active and passive devices formed within the wafer. Herein, a smooth substrate 200 is shown to simplify the diagram. An insulating layer 202 such as an oxide layer or organanosilicate glass (OSG) is deposited on the substrate 200. Interconnection trenches are formed in the insulating layer 202, and a metal layer 204 such as a copper layer has been deposited overlying the insulating layer 202 and filling the trenches. The excess copper layer 204 is then polished back to the insulating layer 102 by CMP to form copper interconnects 204 in the insulating layer 202.

Figure 2B:
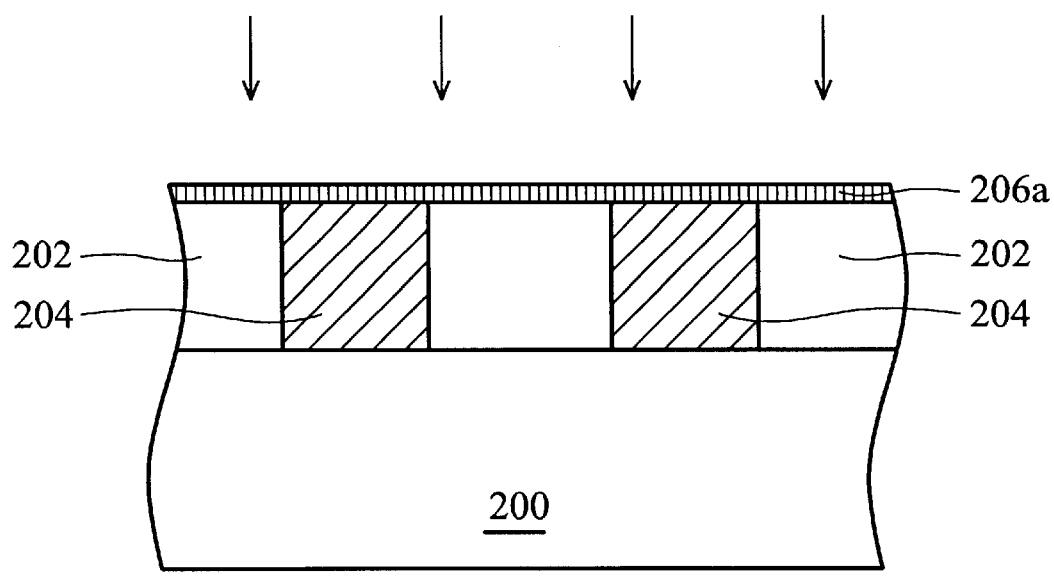

In FIG. 2b, a sealing layer has been deposited on the copper interconnects 204 and the insulating layer 202. In this embodiment, the sealing layer is SiN, and can be SiC, SiCH, SiCO or SiCN. Thereafter, a plasma treatment is performed on the sealing layer by a reaction gas including at least one of $CO_2$, $NH_3$, $NO_2$, $SiH_4$, trimethylsilane (3MS), and tetramethylsilane (4MS) to create active sites on the surface of the sealing layer as indicated 206a. Herein, the flow rates of $CO_2$, $NH_3$, $NO_2$, $SiH_4$, 3MS; and 4MS are, respectively, 500~1500 sccm, 1500~3500 sccm, 500~1500 sccm, 500~1500 sccm, 500~2500 sccm and 500~2500 sccm.

Figure 2C:
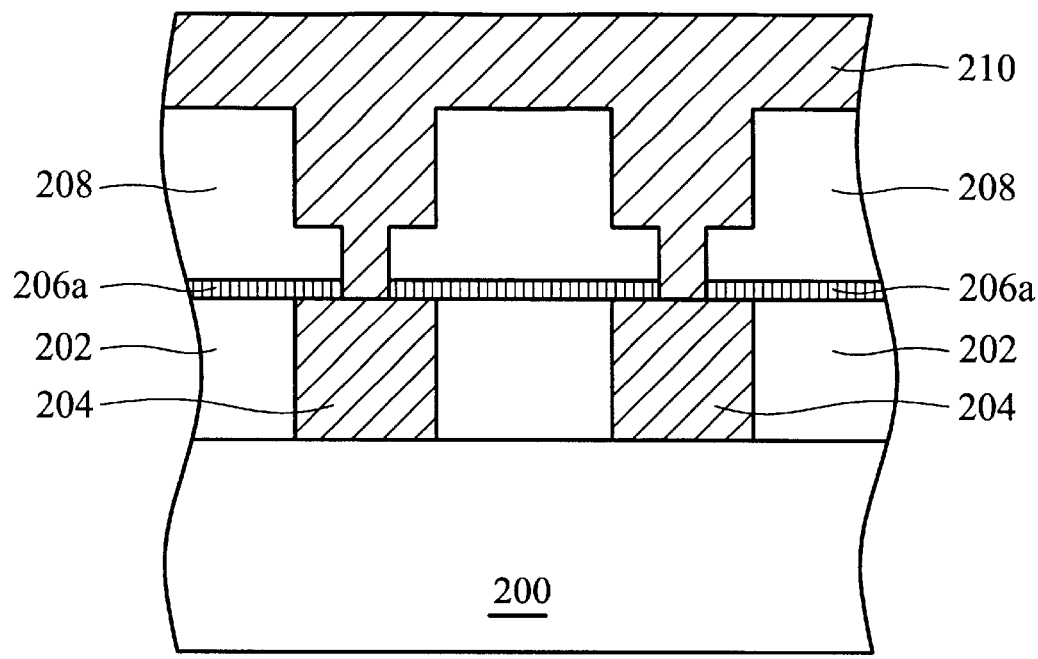

In FIG. 2c, a low k dielectric layer 208, such as SilK, FLARE, and PAE2, having dual damascene structures is formed on the sealing layer 206a. Subsequently, a copper layer 210 is deposited overlying the low k dielectric layer 208 and filling the dual damascene structures. Herein, the copper layer 210 in the dual damascene structures is connected to the copper interconnects 204 through removal of part of the sealing layer 206a.

Figure 2D:
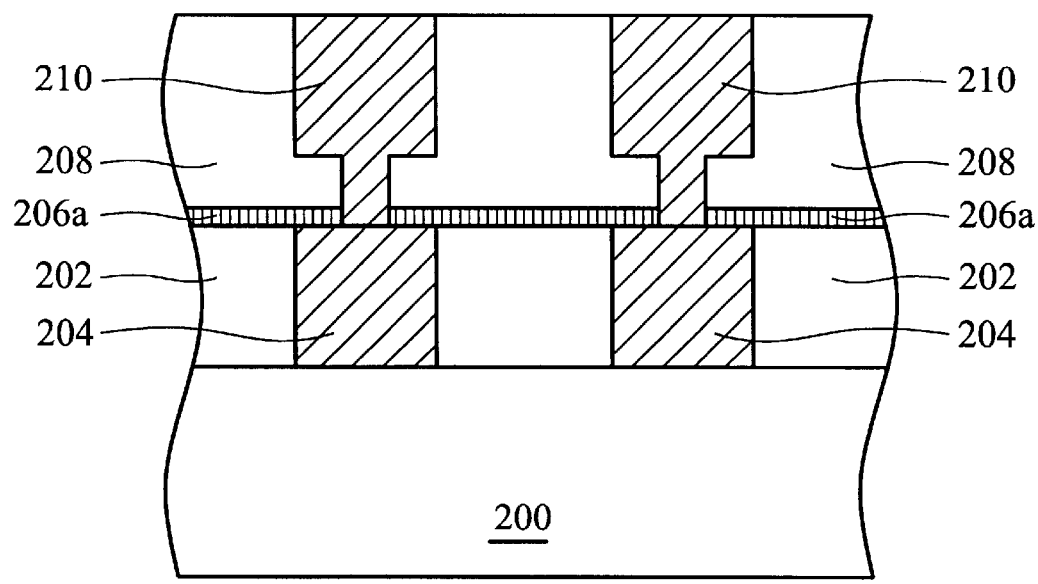

In FIG. 2d, the excess copper layer 210 is then polished back to the low k dielectric layer 208 by CMP to form the copper interconnect 210 in the low k dielectric layer 208.

As mentioned above, the sealing layer 206a serves as a metal barrier layer to prevent the copper atoms from the layers 204, 210 diffusing into insulating layer 202 and the low k dielectric layer 208, and can be used as an etch stop layer for a dual damascene process. Since the active sites on the surface of the sealing layer 206a react with the low k dielectric layer 208, the adhesion of the low k dielectric layer 208 and sealing layer 206a can be improved. Thus, according to the invention, the low k dielectric layer peeling from the sealing after subsequent CMP can be prevented. That is, reliability problems due to the poor adhesion between the sealing layer and low k dielectric layer can be eliminated.

Figure 3A:
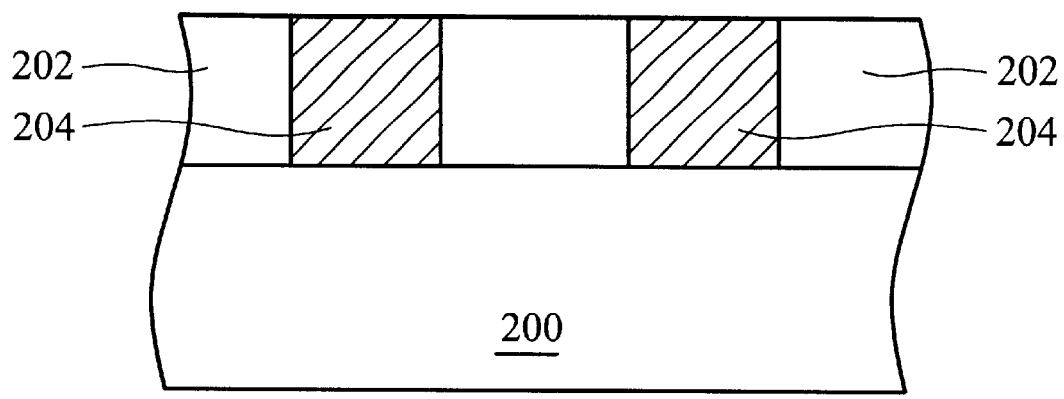
FIGS. 3a–3d are sectional diagrams showing a dual damascene wiring according to the second embodiment of the present invention.

FIGS. 3a–3d show a dual damascene wiring according to the second embodiment of the present invention. Herein, the same parts with the FIGS. 2a–2d use the same symbols. In FIG. 3a, a substrate 200 is provided. An insulating layer 202 such as an oxide layer or organanosilicate glass (OSG) is deposited on the substrate 200. Interconnection trenches are formed in the insulating layer 202, and a metal layer 204 such as a copper layer has been deposited overlying the insulating layer 202 and filling the trenches. The excess copper layer 204 is then polished back to the insulating layer 102 by CMP to form copper interconnects 204 in the insulating layer 202.

Figure 3B:
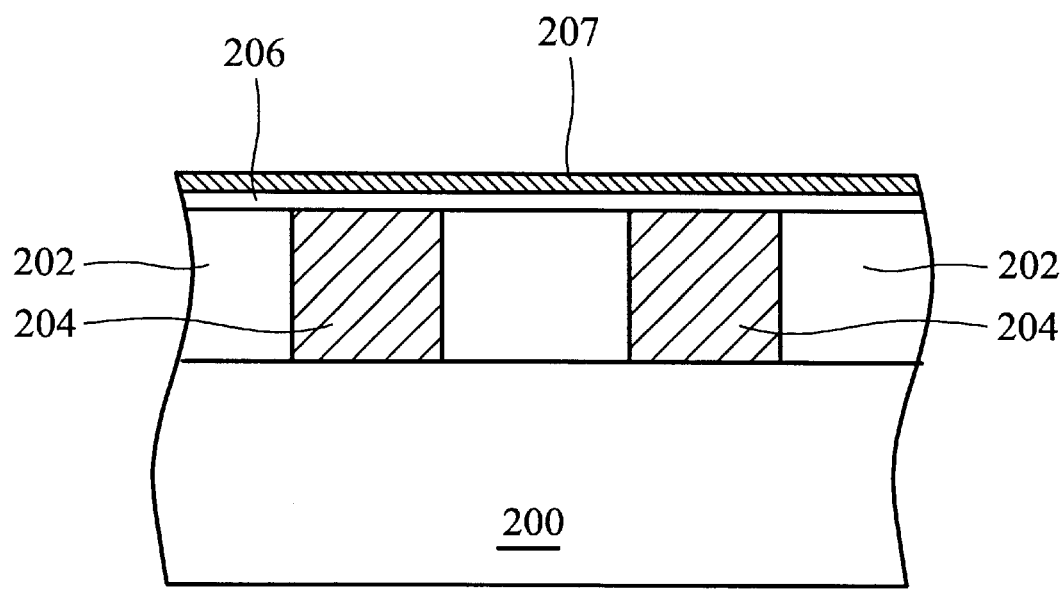

In FIG. 3b, a sealing layer 206 , such as SiN, SiC, SiCH, SiCO or SiCN, is deposited on the copper interconnects 204 and the insulating layer 202. Thereafter, an adhesion layer 207 is deposited on the sealing layer 20. In this embodiment, there are two approaches to form the adhesion layer 207. One is to use chemical vapor deposition (CVD) by a reaction gas including at least one of $CO_2$, $NH_3$, $NO_2$, $SiH_4$, 3MS, and 4MS, and the other is to coat silicate solution (serves as an adhesion promoter) on the sealing layer. The thickness of the adhesion layer 207 formed by CVD is about 100~200 angstroms, and that formed by coating-silicate solution is about 1000~2000 angstroms.

Figure 3C:
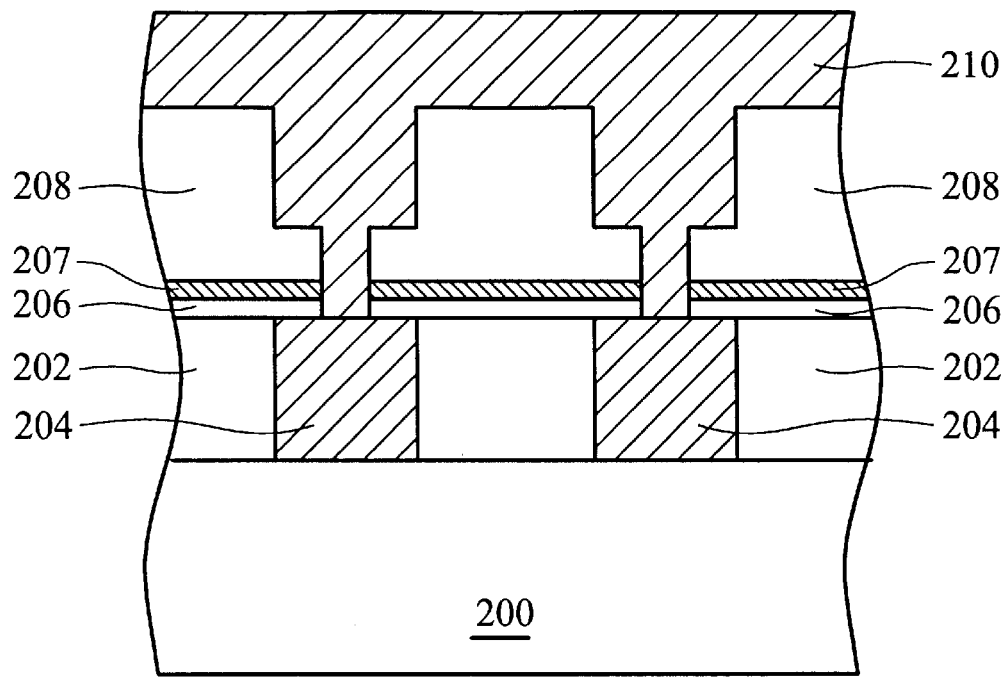

In FIG. 3c, a low k dielectric layer 208, such as SILK, FLARE, and PAE2, having dual damascene structures is formed on the adhesion layer 207. Subsequently, a copper layer 210 is deposited overlying the low k dielectric layer 208 and filled the dual damascene structures. Also, the copper layer 210 in the dual damascene structures is connected to the copper interconnects 204 through removal of part of adhesion layer 207 and the underlying sealing layer 206.

Figure 3D:
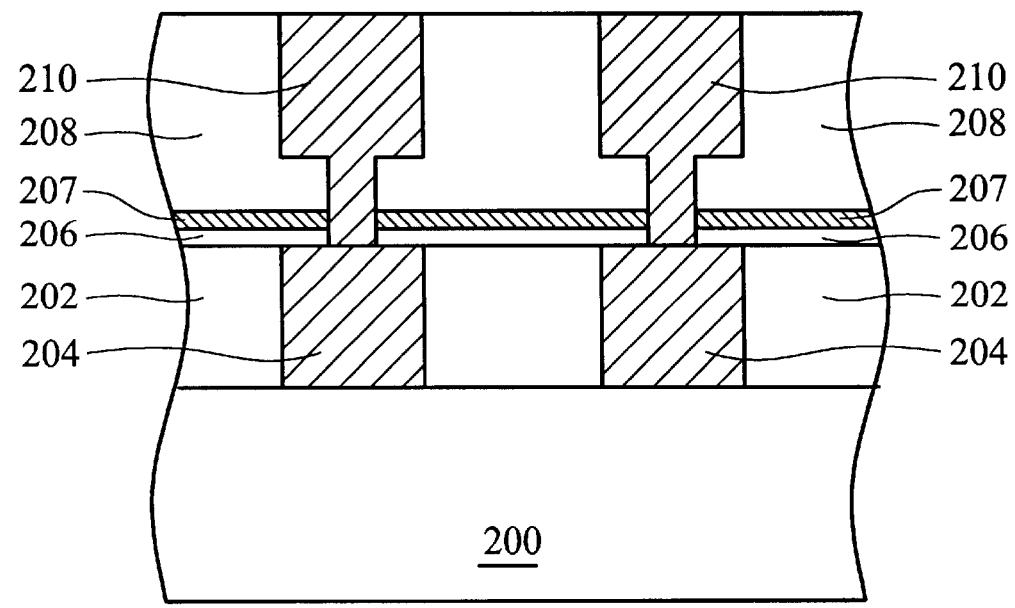

In FIG. 3d, the excess copper layer 210 is then polished back to the low k dielectric layer 208 by CMP to form the copper interconnect 210 in the low k dielectric layer 208.

In this embodiment, the adhesion layer 207 and the sealing layer 206 as a composite barrier layer, and can increase the adhesion with the low k dielectric layer. That is, it has advantages as well as the first embodiment of the invention. In addition, the adhesion layer can be used as a protective layer to prevent the sealing layer damage by stress during the low k dielectric layer is deposited.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a barrier layer between a low k dielectric and metal interconnects, comprising the steps of:
   providing a substrate covered by an insulating layer having the metal interconnects;
   forming a sealing layer on the metal interconnects and the insulating layer;
   performing a plasma treatment on the sealing layer by a reaction gas including at least one of $CO_2$, $NH_3$, $NO_2$, $SiH_4$, trimethylsilane (3MS), and tetramethylsilane (4MS); and
   forming a low k dielectric layer on the sealing layer.

2. The method as claimed in claim 1, wherein the insulating layer is composed of oxide or organosilicate glass (OSG).

3. The method as claimed in claim 1, wherein the sealing layer is composed of SiN, SiC, SiCH, SiCO or SiCN.

4. The method as claimed in claim 1, wherein the flow rate of $CO_2$ is 500~1500 sccm.

5. The method as claimed in claim 1, wherein the flow rate of $NH_3$ is 1500~3500 sccm.

6. The method as claimed in claim 1, wherein the flow rate of $NO_2$ is 500~1500 sccm.

7. The method as claimed in claim 1, wherein the flow rate of $SiH_4$ is 500~1500 sccm.

8. The method as claimed in claim 1, wherein the flow rate of 3MS is 500~2500 sccm.

9. The method as claimed in claim 1, wherein the flow rate of 4MS is 500~2500 sccm.

10. The method as claimed in claim 1, wherein the metal interconnects are composed of copper.

11. A method for forming a barrier layer between a low k dielectric and metal interconnects, comprising the steps of:
    providing a substrate covered by an insulating layer having the metal interconnects;
    forming a sealing layer on the metal interconnects and the insulating layer;

forming an adhesion layer on the sealing layer; and forming a low k dielectric layer on the adhesion layer.

12. The method as claimed in claim 11, wherein the insulating layer is oxide or OSG.

13. The method as claimed in claim 11, wherein the sealing layer is composed of SiN, SiC, SiCH, SiCO or SiCN.

14. The method as claimed in claim 11, wherein the metal interconnects are composed of copper.

15. The method as claimed in claim 11, wherein the adhesion layer is formed by chemical vapor deposition using a reaction gas including at least one of $CO_2$, $NH_3$, $NO_2$, $SiH_4$, 3MS, and 4MS.

16. The method as claimed in claim 11, wherein the adhesion layer is formed by coating silicate solution.

17. The method as claimed in claim 15, wherein the thickness of the adhesion layer is 100~200 angstroms.

18. The method as claimed in claim 16, wherein the thickness of the adhesion layer is 1000~2000 angstroms.

* * * * *